United States Patent
Hollmer

(10) Patent No.: US 7,155,357 B2
(45) Date of Patent: Dec. 26, 2006

(54) METHOD AND APPARATUS FOR DETECTING AN UNUSED STATE IN A SEMICONDUCTOR CIRCUIT

(75) Inventor: Shane Hollmer, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 253 days.

(21) Appl. No.: 10/339,218

(22) Filed: Jan. 9, 2003

(65) Prior Publication Data

US 2004/0138841 A1 Jul. 15, 2004

(51) Int. Cl.
G06F 19/00 (2006.01)
G06F 9/00 (2006.01)

(52) U.S. Cl. .............. 702/82; 365/185.09; 365/185.29; 713/1 E

(58) Field of Classification Search ................ 702/81, 702/82, 117, 120, 121; 324/158.1; 714/734, 714/738, 36; 716/4, 8; 365/200, 201, 185.09, 365/185.29; 235/380; 701/29; 345/168; 708/140; 711/138; 360/75; 710/3, 100
See application file for complete search history.

(56) References Cited

U.S. PATENT DOCUMENTS

| 4,614,861 A | 9/1986 | Pavlov et al. ............... 235/380 |
|---|---|---|
| 4,960,724 A * | 10/1990 | Watanabe et al. .............. 716/2 |
| 5,586,075 A * | 12/1996 | Miwa ..................... 365/185.29 |
| 5,696,936 A | 12/1997 | Church et al. .............. 711/138 |
| 5,717,428 A | 2/1998 | Barrus et al. ............... 345/168 |
| 5,771,474 A | 6/1998 | Matt et al. ..................... 701/29 |
| 5,859,804 A * | 1/1999 | Hedberg et al. ............ 365/201 |
| 5,862,083 A * | 1/1999 | Tobita et al. .......... 365/185.09 |
| 5,883,804 A | 3/1999 | Christensen ................. 700/96 |
| 5,930,169 A * | 7/1999 | Iwata et al. ............ 365/185.09 |
| 5,936,788 A | 8/1999 | Boutaghou et al. ........... 360/75 |
| 6,219,291 B1 | 4/2001 | Sowards et al. ............ 365/207 |
| 6,324,556 B1 | 11/2001 | Nott et al. ................... 708/140 |
| 6,519,716 B1 | 2/2003 | Branstad ...................... 714/36 |
| 6,621,734 B1 * | 9/2003 | Hamaguchi et al. ... 365/185.09 |
| 6,748,459 B1 | 6/2004 | Lin et al. ........................ 710/3 |
| 2002/0116561 A1 | 8/2002 | Henry et al. ................ 710/100 |
| 2002/0167847 A1 * | 11/2002 | Iwase .................... 365/189.01 |
| 2004/0139307 A1 * | 7/2004 | Barnett .......................... 713/1 |

* cited by examiner

Primary Examiner—Bryan Bui
Assistant Examiner—John H. Le
(74) Attorney, Agent, or Firm—DLA Piper US LLP

(57) ABSTRACT

An unused state detection circuit is disclosed that detects an unused state in a semiconductor circuit. A semiconductor circuit is "unused" when the unused state detection circuit has not been permanently cleared. When a semiconductor circuit is first powered up, the unused state detection circuit will detect that the semiconductor circuit has not previously been "used" and can automatically activate a boot up procedure or a testing procedure (or both). After the semiconductor circuit is used, the unused state detection circuit provides an indication that the semiconductor circuit is no longer unused. The unused state detection circuit uses the state of a dedicated non-volatile memory array or a dedicated region of the general non-volatile memory portion of the semiconductor circuit to detect whether the semiconductor circuit has been previously unused.

5 Claims, 11 Drawing Sheets

METHOD AND APPARATUS FOR DETECTING AN UNUSED STATE IN A SEMICONDUCTOR CIRCUIT

CROSS REFERENCE TO RELATED APPLICATION

The present application is related to U.S. patent application Ser. No. 10/339,223 entitled "Method and Apparatus for Initializing a Semiconductor Circuit From an External Interface," filed contemporaneously herewith, assigned to the assignee of the present invention and incorporated by reference herein.

FIELD OF THE INVENTION

The present invention relates generally to a method and apparatus for initializing and testing a semiconductor circuit, such as a secure integrated circuit, and more particularly, to a method and apparatus for initializing and testing an unused semiconductor circuit.

BACKGROUND OF THE INVENTION

Semiconductor circuits, especially of the System on a Chip type, typically contain a microprocessor and non-volatile memory to perform required functions. When a semiconductor circuit is first powered up, the microprocessor requires a source of instructions to be able to function. Typically, semiconductor circuits include a read only memory (ROM) array, often referred to as a "boot ROM," that has been masked at the time of manufacture to include the appropriate program code that allows the microprocessor to boot up and initialize the semiconductor circuit when power is first applied. A boot ROM, however, increases the required surface area of the semiconductor circuit, as well as the complexity of the microprocessor initialization processes. If the ROM is created as part of the fabrication process, errors that cause changes to this program code are very expensive and time consuming. In addition, a boot ROM impairs the security of a semiconductor circuit, since each cell in the boot ROM can be examined, e.g., using a microscope, to identify the program code that has been loaded onto the boot ROM. The security impairment is of particular concern when the semiconductor circuits are used for secure applications, such as banking or the recording of personal or proprietary information.

In addition, a semiconductor circuit is typically tested and trimmed when it is first booted up. Generally, a new semiconductor circuit is connected to a testing station that tests various features and functions of the semiconductor circuit to ensure that the semiconductor circuit is operating within specified tolerances. In addition, the testing station typically trims other devices on the semiconductor circuit that may require adjustment to operate at a desired setting.

Thus, a need exists for a method and apparatus for determining when a semiconductor circuit is unused so that it can be initialized or tested or both.

SUMMARY OF THE INVENTION

Generally, a method and apparatus are disclosed for detecting an unused state in a semiconductor circuit. An unused state detection circuit is disclosed that detects whether a semiconductor circuit is unused. When a semiconductor circuit is first powered up, the unused state detection circuit will detect that the semiconductor circuit has not previously been used and will automatically activate a boot up procedure or a testing procedure (or both). A semiconductor circuit is "unused" when the unused state detection circuit has not been permanently cleared.

The unused state detection circuit detects when the semiconductor circuit is first powered up and initialized and thereafter provides an indication that the semiconductor circuit is no longer unused. In this manner, the present invention allows special processing to be performed on an unused semiconductor circuit, such as testing or initialization (or both), and then permanently clears the unused state so that the security of the semiconductor circuit is not compromised. Generally, the unused state detection circuit uses the state of a non-volatile memory array to detect whether the semiconductor circuit has been previously unused. The unused state detection circuit detects whether a semiconductor circuit is unused by employing (i) a dedicated mini-array of non-volatile memory cells, or (ii) a dedicated region of the general non-volatile memory portion of the semiconductor circuit.

In an embodiment employing a dedicated mini-array of non-volatile memory cells, at least two active bit lines, blprg and bler, are employed corresponding to program and erase, respectively. The first bit line, blprg, is only programmable, and may not be erased. The second bit line, bler, is only eraseable and may not be programmed. Generally, all of the bits in the dedicated non-volatile memory array are initially in approximately the same state, which could be erased, programmed or somewhere in between. An offset current is added to one of the bit lines, such that when the offset bit line is compared to the bit line that has not been offset, a difference can be detected. The current difference can be used to indicate, for example, when the bit line has been erased. Thus, when all of the bits in the dedicated non-volatile memory array are initially in approximately the same state, this is deemed, for example, to be an unused state. Subsequently, the bits on the offset bit line can be programmed and the bits on the bit line that has not been offset can be erased. At that point, the same bit line will sense as programmed or used, because the current difference between erased bit(s) and programmed bit(s) is more than the offset current applied.

In an embodiment employing one or more dedicated bytes within the regular non-volatile memory array, the dedicated bytes are compared using a reference current and detecting a predefined pattern. In one implementation, all bits in the one or more dedicated byte(s) in an unused state will be in a neutral state. The neutral state will provide a predictable level of current that can be compared to a reference current to distinguish neutral cells from cells that have been programmed or erased by detecting an all '1'or all '0'pattern. In a predefined pattern implementation, all bits in the one or more dedicated byte(s) in an unused state will be in a charged or uncharged state but all will be in a similar state or at least in a uniform pattern. When sensed, these byte(s) will not match a random pattern that has been selected for comparison, indicating the unused state. Subsequently, the byte(s) can be erased and programmed to the specific pattern and a comparitor will read true, indicating a used state. The unused state is removed by simply erasing and programming a specific pattern into the byte(s).

A more complete understanding of the present invention, as well as further features and advantages of the present invention, will be obtained by reference to the following detailed description and drawings.

DETAILED DESCRIPTION

Figure 1:
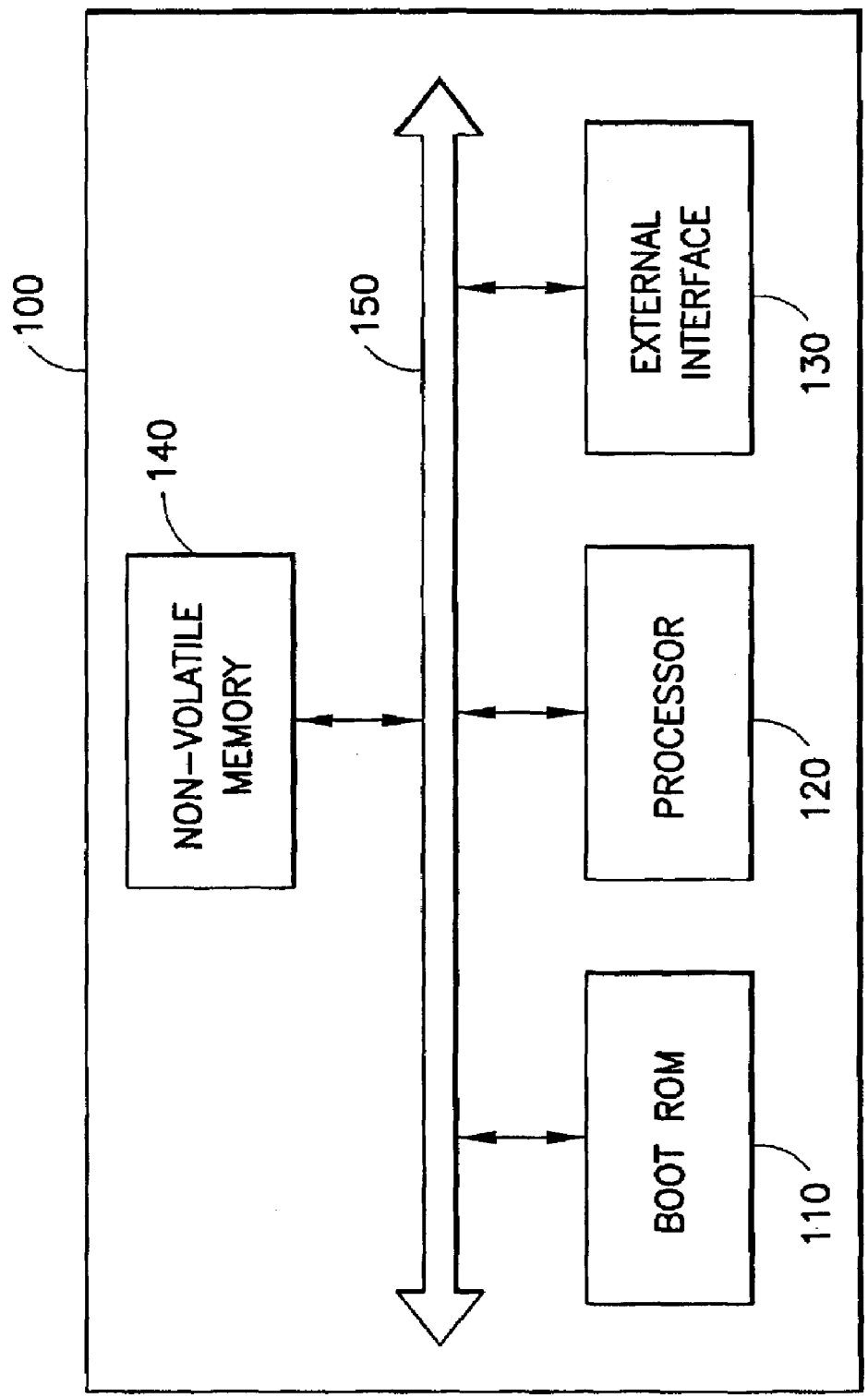
FIG. 1 is a schematic block diagram of a conventional semiconductor circuit.

FIG. 1 is a schematic block diagram of a conventional semiconductor circuit 100. As shown in FIG. 1, the conventional semiconductor circuit 100 includes a Boot ROM 110, a processor 120, an external interface 130 and a non-volatile memory 140, each communicating over a bus 150. As previously indicated, when the conventional semiconductor circuit 100 is first powered up, the processor 120 accesses the Boot ROM 110 to obtain the appropriate program code for the boot up process.

Figure 2:
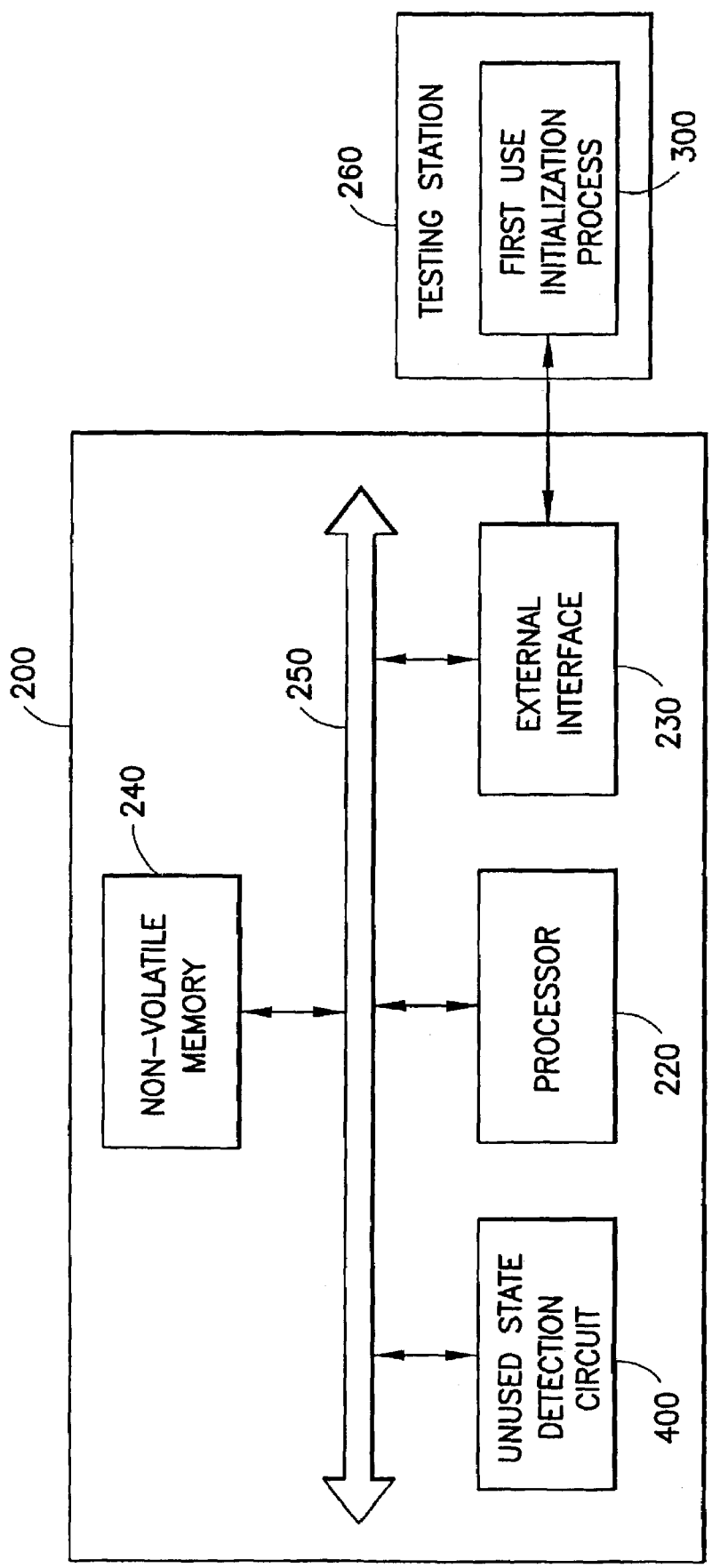
FIG. 2 is a schematic block diagram of a semiconductor circuit incorporating features of the present invention.
Figure 10:
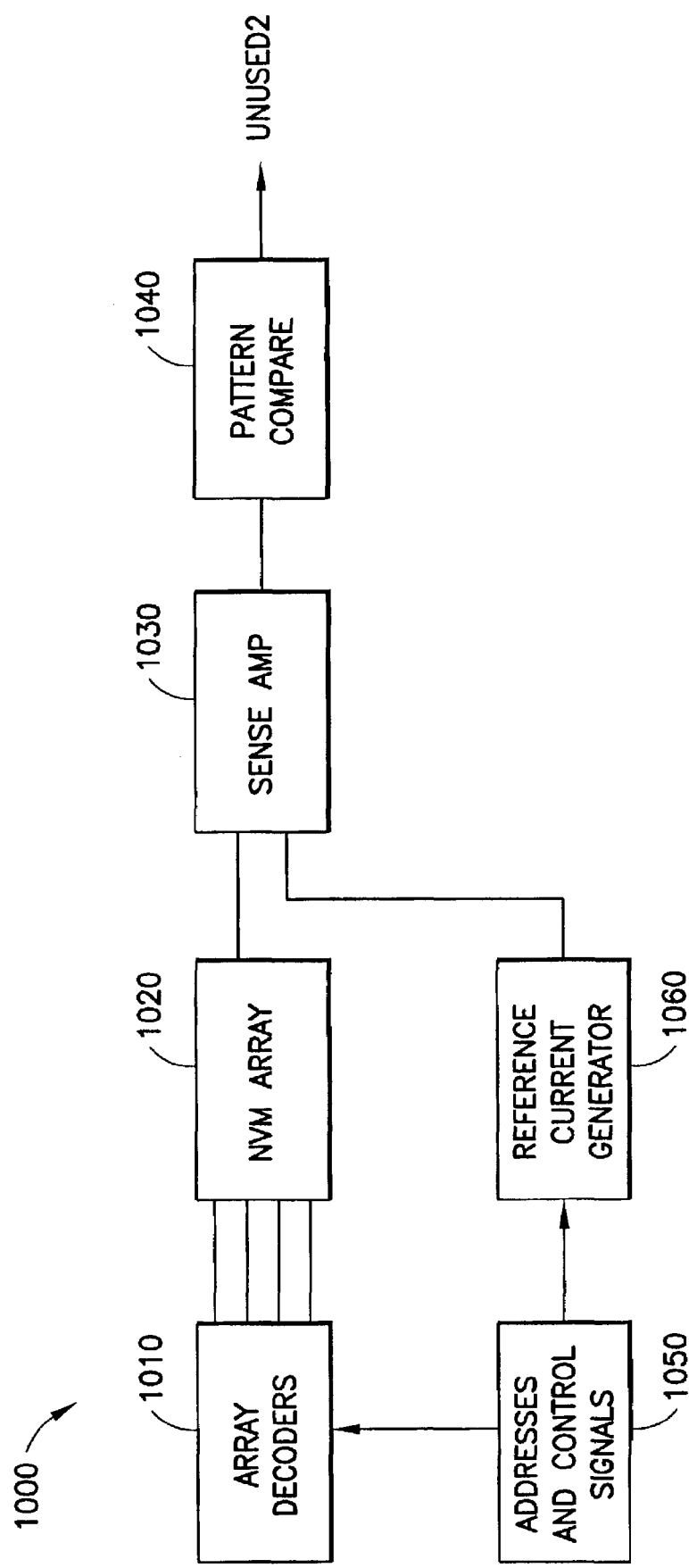
FIG. 10 is a schematic block diagram that is suitable for use by alternate embodiments of the unused state detection circuit of FIG. 4.

FIG. 2 is a schematic block diagram of a semiconductor circuit 200 incorporating features of the present invention. As shown in FIG. 2, the semiconductor circuit 200 includes an unused state detection circuit 400, discussed further below in conjunction with FIG. 4, a processor 220, an external interface 230 and a non-volatile memory 240, each communicating over a bus 250. The processor 220, interface 230 and a non-volatile memory 240 operate in a conventional manner. The external interface 230 may be embodied in many forms, but typically would be a recognized standard, for example, as a serial interface, parallel interface or a Universal Serial Bus (USB). According to one aspect of the invention, when the semiconductor circuit 200 is first powered up, the unused state detection circuit 400 will detect that the semiconductor circuit 200 has not previously been used, e.g., tested or initialized, and had its unused state cleared. In one implementation, the unused state detection circuit 400 will automatically enable special boot up procedures or testing procedures (or both). As used herein, a semiconductor circuit is considered "unused" when the unused state detection circuit 400 has not been permanently cleared. In various embodiments of the present invention described herein, an unused state detection circuit, discussed further below in conjunction with FIGS. 4 and 10, detects whether a semiconductor circuit is unused by employing a dedicated mini-array of non-volatile memory (FIG. 4) or a dedicated region of the general non-volatile memory portion of the semiconductor circuit (FIG. 10).

As discussed hereinafter, the external interface 230 can optionally be connected to a testing station 260 or another computing device that provides an instruction stream for execution by the processor 220, such as a stream of bytes having predefined values to indicate appropriate instructions. The testing station 260 communicates with the semiconductor circuit 200 using the external interface 230, in a manner described further below in conjunction with FIG. 3. Generally, the testing station 260 issues a command to the semiconductor circuit 200 through the external interface 230 that indicates a specific instruction that should be implemented. In this manner, the semiconductor circuit 200 is initialized and the non-volatile memory 240 is loaded with the application software. The processor 220 will continue to obtain instructions from the external interface 230 until the initialization process is complete, which may be indicated, for example, by some predefined instruction or pattern issued by the testing station 260 or by other methods, such as removing power from the semiconductor circuit 200.

Figure 3:
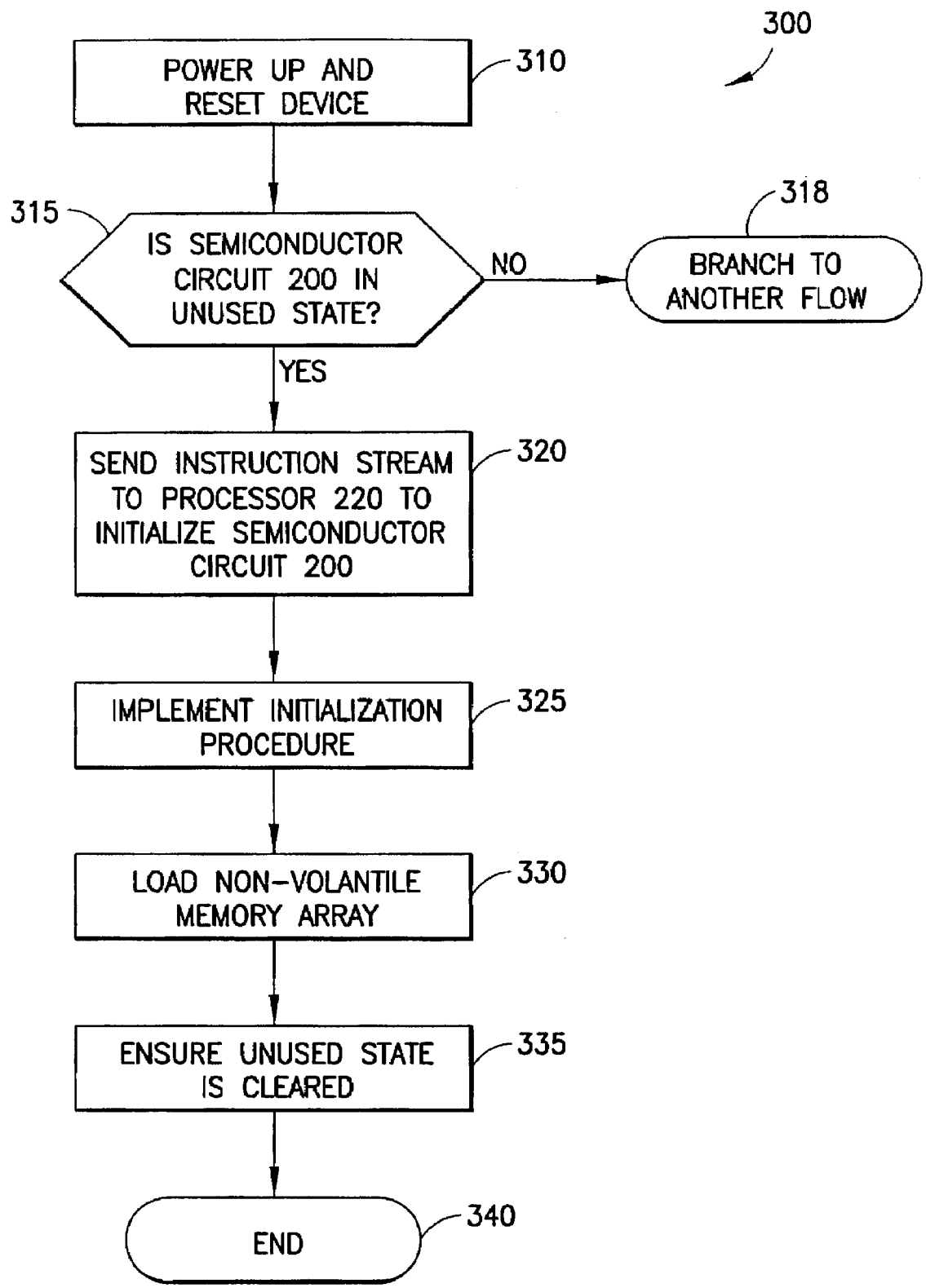
FIG. 3 is a flow chart describing an exemplary implementation of a first use initialization process implemented by the testing station of FIG. 2.

FIG. 3 is a flow chart describing an exemplary implementation of the first use initialization process 300, implemented by the testing station 260. As shown in FIG. 3, the testing station 260 initially powers up and resets the semiconductor circuit being tested to a known state during step 310. Thereafter, a test is performed during step 315 to determine if the semiconductor circuit 200 is in an unused state. The testing station 260 can determine if the semiconductor circuit 200 is in an unused state, for example, by communicating with the semiconductor circuit 200 on the external interface 230. If a valid response is received from the semiconductor circuit 200, the testing station 260 can assume the semiconductor circuit 200 is in an unused state and is obtaining instructions from the testing station 260 for initialization. In a further variation, the unused state detection circuit 400 can set a flag or another indicator that may be accessed by the testing station 260 and provides an indication that the semiconductor circuit 200 is in an unused state.

If it is determined during step 315 that the semiconductor circuit 200 is not in an unused state, then program control terminates or branches to a different flow during step 318, for example, to perform testing of used semiconductor circuits. If, however, it is determined during step 315 that the semiconductor circuit 200 is in an unused state, then program control proceeds to step 320 for initialization or testing (or both) of the unused semiconductor circuit 200.

The first use initialization process 300 then sends an instruction stream over the external interface 230 during step 320 to the processor 220 to initialize the semiconductor circuit 200. Thereafter, the first use initialization process 300 performs an initialization procedure during step 325 that may include, e.g., testing of the various features and functions of the semiconductor circuit 200.

The non-volatile memory is then loaded during step 330 with the appropriate code for further execution (since the previous code may have been overwritten during the pattern testing process). Finally, the testing station 260 ensures that the unused state of the emulated EEPROM memory array 200 is permanently cleared, in the manner described herein. Thereafter, program control terminates during step 340.

It is noted that while the exemplary first use initialization process 300 incorporates testing functions performed by an external testing station 260, some or all of the testing of the semiconductor circuit 200 may actually be performed by testing functions embedded on the semiconductor circuit 200, as would be apparent to a person of ordinary skill in the art.

Unused State Detection

As previously indicated, the unused state detection circuit 400 detects when the semiconductor circuit 200 is first powered up and initialized and thereafter provides an indication that the semiconductor circuit 200 is no longer unused. Generally, as discussed further below, the unused state detection circuit 400 uses the state of a non-volatile memory array to detect whether the semiconductor circuit 200 has been previously unused. The present invention recognizes that the particular state of a non-volatile memory cell will be unknown, i.e., whether the cell is charged or uncharged. The present invention provides a method that can determine whether a semiconductor circuit 200 has been previously unused independent of whether the non-volatile memory cells are charged or uncharged.

In one exemplary embodiment, discussed further below in conjunction with FIGS. 4 and 5, the present invention detects whether a semiconductor circuit 200 has been previously unused using a dedicated mini-array 500 of non-volatile memory cells. The array 500 of non-volatile memory cells includes two active bit lines, blprog and bler, corresponding to program and erase, respectively. The first bit line, blprg, is only programmable, and may not be erased. The second bit line, bler, is only eraseable and may not be programmed.

Generally, all of the bits in the non-volatile memory array 500 are initially in approximately the same state, which could be erased, programmed or somewhere in between. An offset current is added to one of the bit lines, such that when the offset bit line is compared to the bit line that has not been offset, a difference can be detected. The current difference can be used to indicate, for example, when the bit line has been erased. The offset current should be set approximately between the current level of a programmed device and an erased device. For example, if a cell in a programmed state draws 5 µA and in an erased state draws 50 µA then the offset current, for the embodiment using two cells per bit line as shown in FIG. 5, should be approximately 45 µA (100 µA from two cells minus 10 µA from two cells divided by two). In addition, depending on the technology and other information, the offset current can be skewed to favor either the programmed or erased state.

When all of the bits in the non-volatile memory array 500 are initially in approximately the same state, this is deemed to be an unused state. Subsequently, the bits on the offset bit line can be programmed and the bits on the bit line that has not been offset can be erased. At that point, the same bit line will sense as programmed or used, because the current difference between an erased bit(s) and programmed bit(s) is more than the offset current applied. The erase and program operations of the non-volatile memory 500 use the same timing and voltages as those of the regular non-volatile memory array 240.

Figure 4:
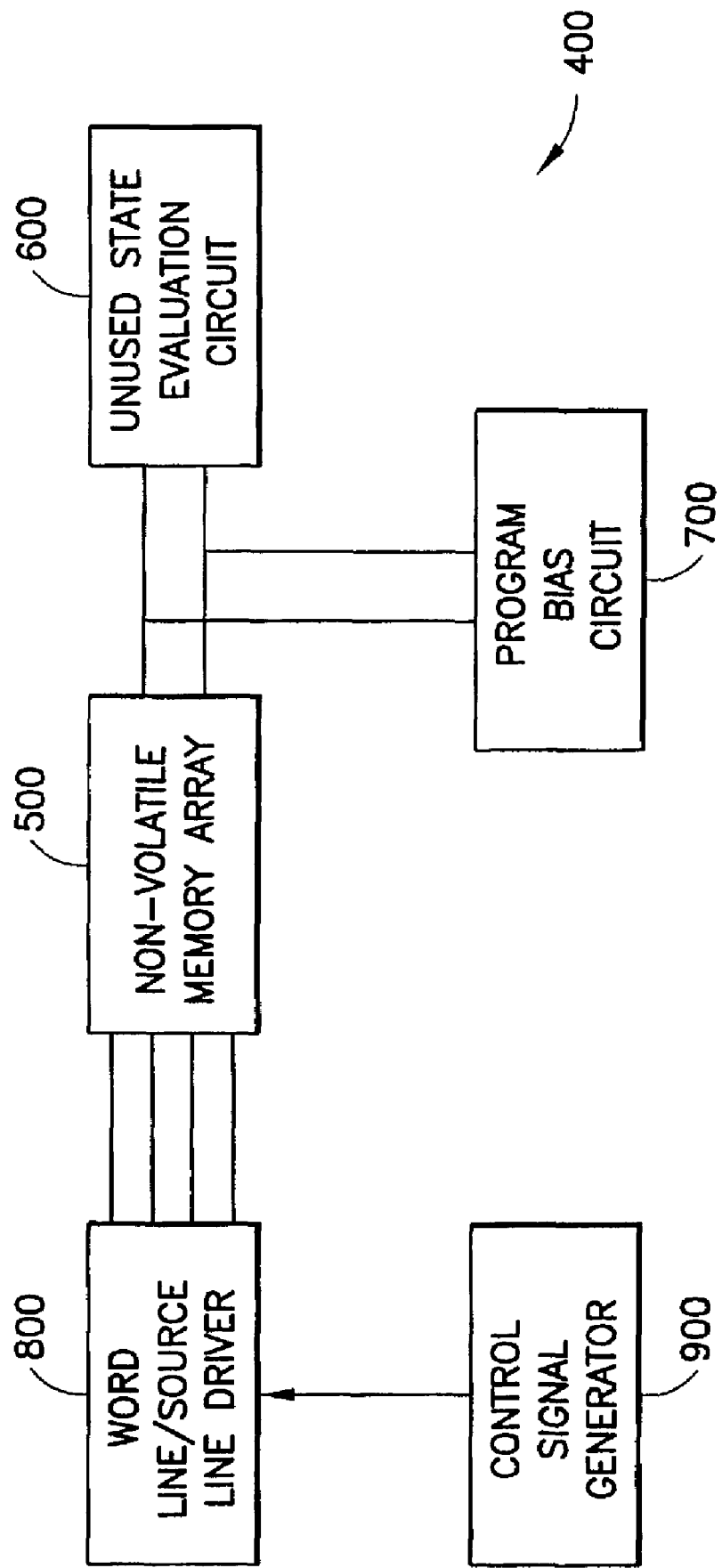
FIG. 4 is a schematic block diagram of the unused state detection circuit of FIG. 2.

FIG. 4 is a schematic block diagram of one possible embodiment for the unused state detection circuit 400 of FIG. 2. As shown in FIG. 4, the unused state detection circuit 400 includes the non-volatile memory array 500, discussed further below in conjunction with FIG. 5, an unused state evaluation circuit 600, discussed further below in conjunction with FIG. 6, a program bias circuit 700, discussed further below in conjunction with FIG. 7, a control and word line/source line driver 800, discussed further below in conjunction with FIG. 8, and a control signal generator 900, discussed further below in conjunction with FIG. 9. The unused state detection circuit 400 generates an unused flag indicator until the semiconductor circuit 200 is first powered up and the unused state detection is permanently cleared. Thereafter, the unused state detection circuit 400 provides an indication that the semiconductor circuit 200 is no longer unused.

Figure 5:
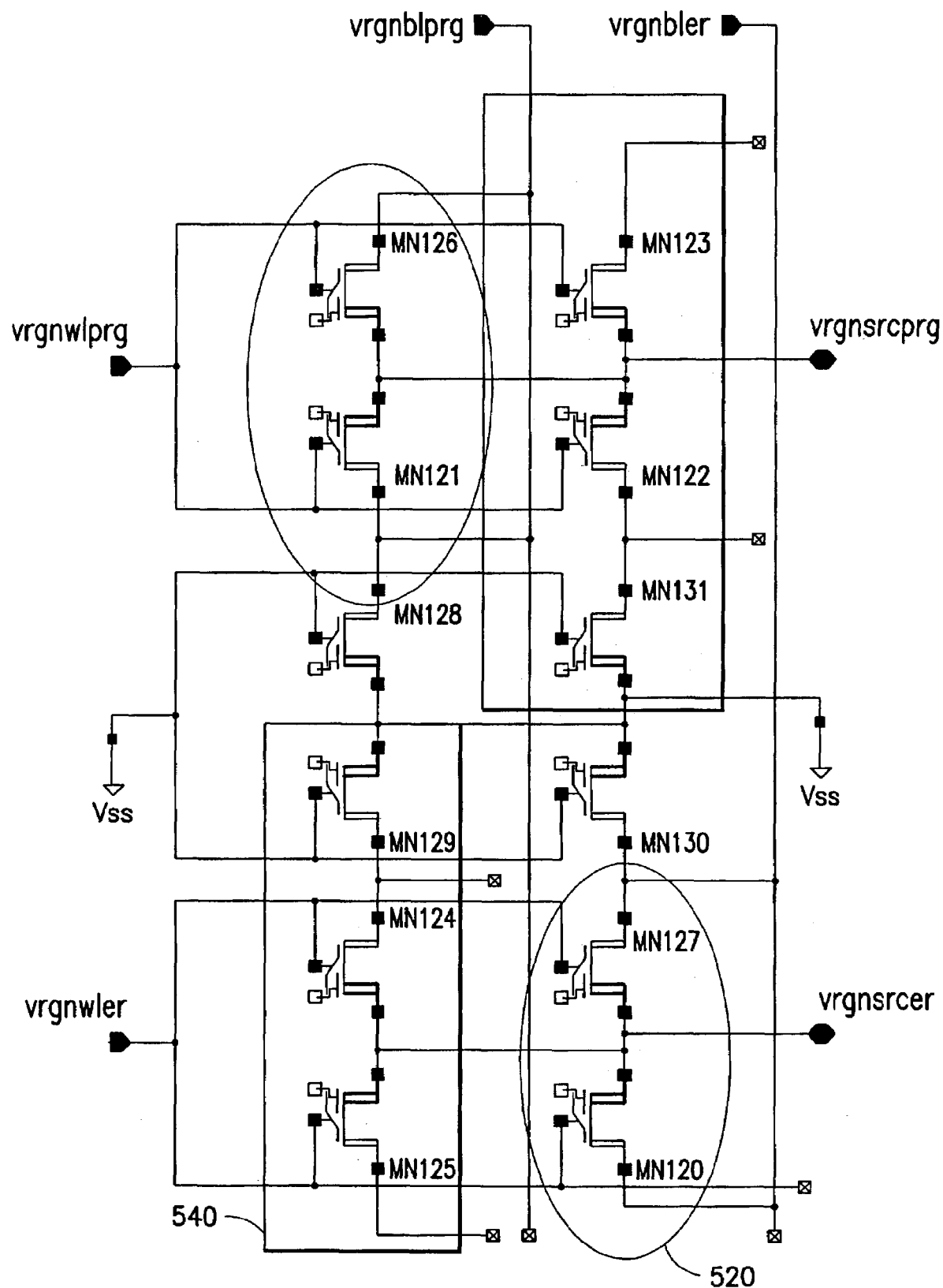
FIG. 5 is a circuit diagram of an exemplary non-volatile memory array of FIG. 4.

FIG. 5 is a circuit diagram of an exemplary non-volatile memory array 500 incorporating features of the present invention. It is noted that the symbols used are for one possible non-volatile memory technology, however, it should be clear to someone skilled in the art that virtually any non-volatile memory technology could be used. As shown in FIG. 5, the non-volatile memory array 500 includes two active bit lines, blprog and blerase. The non-volatile memory array 500 includes a number of transistors. A first pair of transistors 510 may only be programmed, and may not be erased. The second pair of transistors 520 may only be erased, and may not be programmed. The program and erase transistors 510, 520, respectively, in the non-volatile memory array 500 are configured such that the drain is accessed via the bit line inputs, blprg and bler, the gate is accessed via the word line inputs, wlprg and wler, and the source is accessed via the source line inputs, srcprg and srcer, respectively. The program transistors 510 are programmed to remove the unused state. Likewise, the erase transistors 520 are erased to remove the unused state. It is noted that two transistors 510, 520 are used in the exemplary embodiment for each of the program and erase operations, respectively, to average out the odd/even effects that can occur during manufacturing. However, individual transistors or sets of transistors can also be employed, as would be apparent to a person of ordinary skill in the art.

In operation, before the semiconductor circuit 200 is first powered up and initialized (i.e., when the semiconductor circuit 200 is unused), the two program transistors 510 and the two erase transistors 520 are in approximately the same state, which could be erased, programmed or somewhere in between, and provide equal of amounts of currents during sensing. The program transistors 510 can be programmed by applying a high voltage (e.g., 10V) to the source program line, srcprg, a select voltage (e.g., 1.5V) to the word line program, wlprg, and a small current sink (e.g., 2 µA) to the bit line program, blprg. Once programmed, the program transistors 510 will not provide current during sensing.

The erase transistors 520 can be erased by applying a high voltage (e.g., 13V) to the word line erase, wler, and applying ground to the source line erase, srcer, and to the bit line erase, bler. Once erased, the erase transistors 520 will provide a significant current, e.g., on the order of 35 µA each, during sensing.

In order to prevent edge effects, the non-volatile memory array 500 may optionally include a number of additional transistor and associated bit lines (not shown), so that the two active transistor and bit lines, BLprog and BLerase, are uniform, in a known manner. In another variation, the bit lines of the transistors 540 in the program bit line have their bit line contacts removed so that they do not influence the program transistors 510. Similarly, the bit lines of the transistors 530 in the erase bit line have their bit line contacts removed so that they do not influence the erase transistors 520.

Figure 6A:
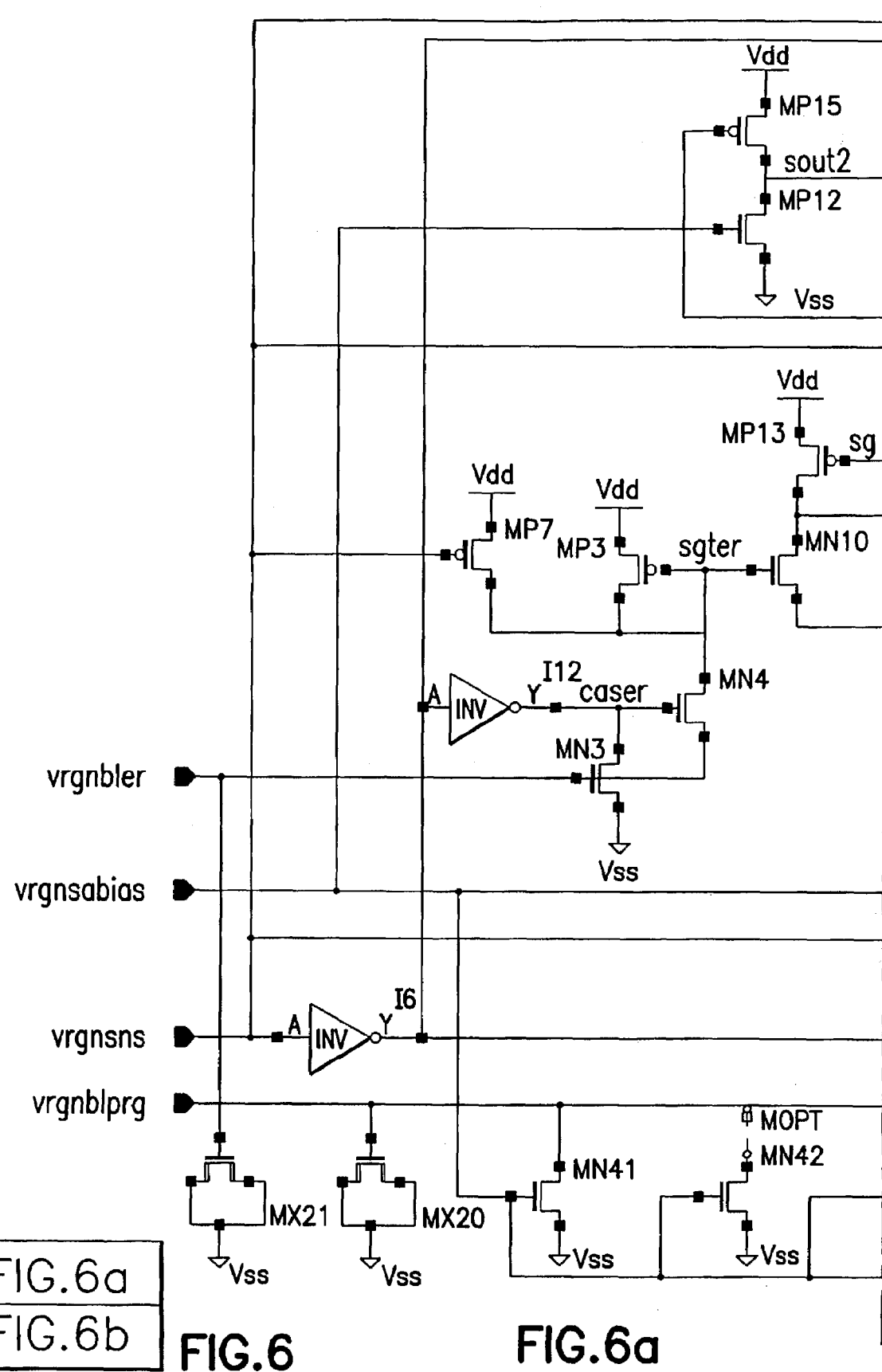
FIG. 6 is a circuit diagram of an exemplary unused state evaluation circuit of FIG. 4.
Figure 6B:
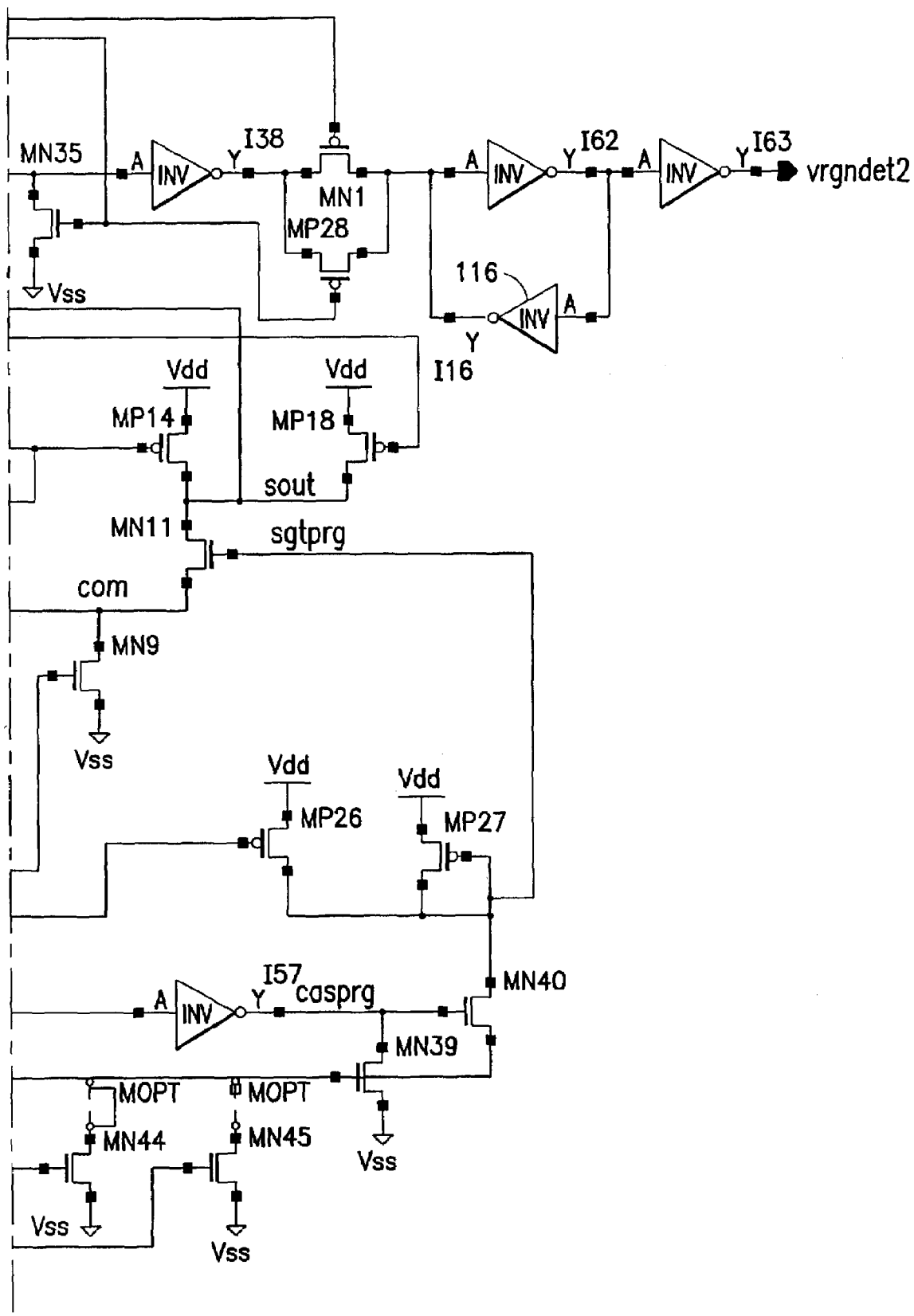

FIG. 6 is a circuit diagram of an exemplary unused state evaluation circuit 600 incorporating features of the present invention. As shown in FIG. 6, the unused state evaluation circuit 600 includes a first cascode amplifier structure 610 that feeds an input MN10 620 of a differential pair 630. A second cascode amplifier structure 640 feeds an input MN11 650 of the differential pair 630.

As previously indicated, an offset current is added to one of the bit lines, such that when the offset bit line is compared to the bit line that has not been offset, a difference can be detected. The offset current is generated by a set of transistors 660. The first cascode amplifier structure 610 converts the current on the bit line erase input, bler, to a voltage. The second cascode amplifier structure 640 converts the current on the bit line program input, blprg, plus the offset current to a voltage. In this manner, the cascode amplifier structures 610, 620, in conjunction with the differential pair 630, compare the currents on the bit line program and bit line erase inputs.

The bias input, sabias, provides an analog voltage level that biases the two stages of the unused state evaluation circuit 600. The sense input, sns, is a control signal that enables the sensing of the state of the cells inside the non-volatile memory array 500. For example, the non-volatile memory array 500 can be enabled whenever the semiconductor circuit 200 is reset or powered up.

For a more detailed discussion of a suitable technique for sensing a memory cell, see, for example, U.S. Pat. No. 6,219,291 to Sowards et al., assigned to the assignee of the present invention and incorporated by reference herein. Generally, the disclosed technique for sensing a memory cell employs a logic level detection circuit that includes a sense amplifier that senses a logic level based on a corresponding current consumption.

Figure 7:
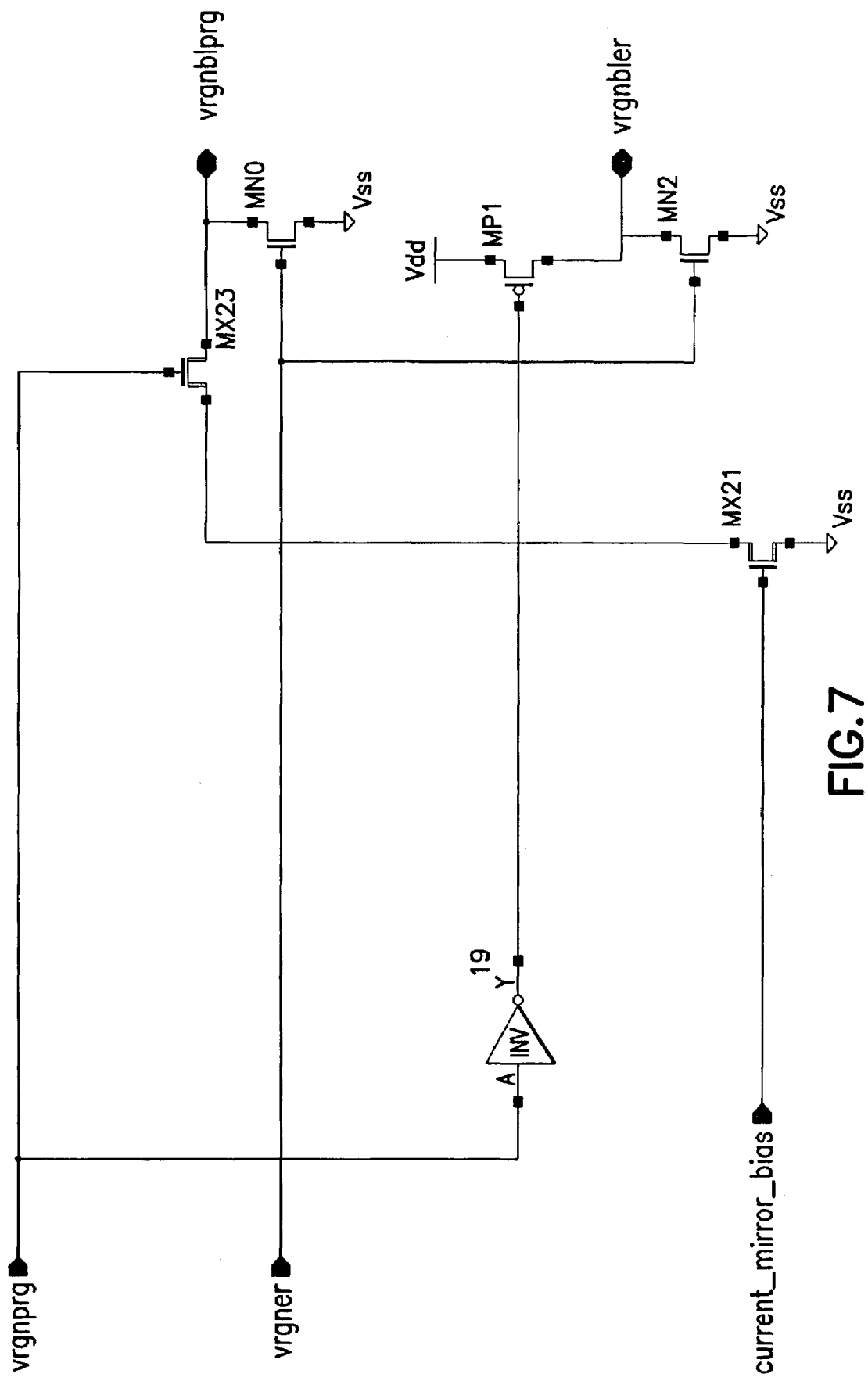
FIG. 7 is a circuit diagram of an exemplary program bias circuit of FIG. 4.

FIG. 7 is a circuit diagram of an exemplary program bias circuit 700 incorporating features of the present invention. The program bias circuit 700 provides current and voltages to the bit lines during programming. The program bias circuit 700 ensures that only transistors on the program transistor line 510 in the non-volatile memory array 500 can be programmed, and that the erase transistor line 520 in the non-volatile memory array 500 cannot be programmed.

As shown in FIG. 7, the inputs prg and er are high during the program and erase modes, respectively. If both inputs prg and er are low, the program bias circuit 700 is in a normal mode and is not generating a bias or influence on the bit line program or bit line erase lines. A current mirror 710 generates a known bias current, on the order of 2 μA in the exemplary embodiment. The bias current is passed by the transistor 730.

In the program mode, i.e., when the prg line is high, the transistor 750 is enabled and pulls the bit line erase output (bler) up to $V_{dd}$. Likewise, in the erase mode, i.e., when the er line is high, the transistor 740 is enabled and pulls the bit line program output (blprg) up to $V_{dd}$.

Figure 8:
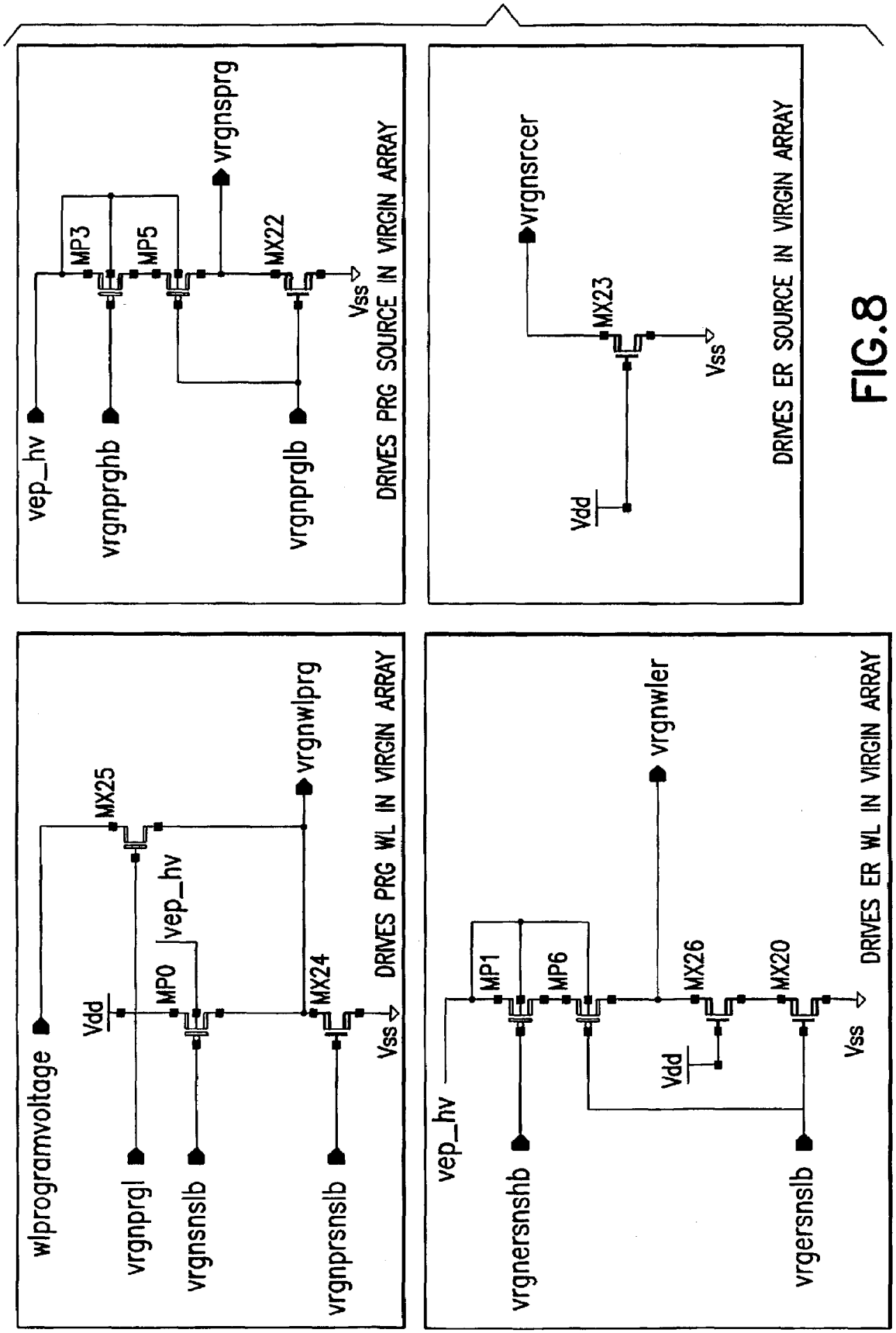
FIG. 8 is a set of circuit diagrams of exemplary word line/source line drivers of FIG. 4.

FIG. 8 is a set of circuit diagrams of exemplary word line/source line drivers 800 incorporating features of the present invention. As shown in FIG. 8, the word line/source line drivers 800 includes a program word line driver 810, a program source line driver 820, an erase word line driver 830 and an erase source line driver 840.

The drivers provide the appropriate conditions to the indicated terminals associated with the word and source lines during the program and erase modes. For one particular technology, the voltages are as follows:

| Mode | Source Condition (Source Line) | Gate Condition (Word Line) | Drain Condition (Bit Line) |
| --- | --- | --- | --- |
| Read (Sense) | 0 V | 2.5 V | 1.0 V |
| Program | 10 V | 1.5 V | −2 μA, 1.0 V |
| Erase | 0 V | 12 V | 0 V |

It is again noted that the drain terminal of each transistor is accessed via the bit line inputs, blprg and bler, the gate terminal is accessed via the word line inputs, wlprg and wler, and the source terminal is accessed via the source line inputs, srcprg and srcer, respectively. Thus, the driver 810 will pass 1.5V to the word line during a program mode, the driver 820 will pass 10V to the source line during a program mode, the driver 830 will pass 12V to the word line during an erase mode and the driver 840 will bring the source line to ground in an erase mode.

Figure 9:
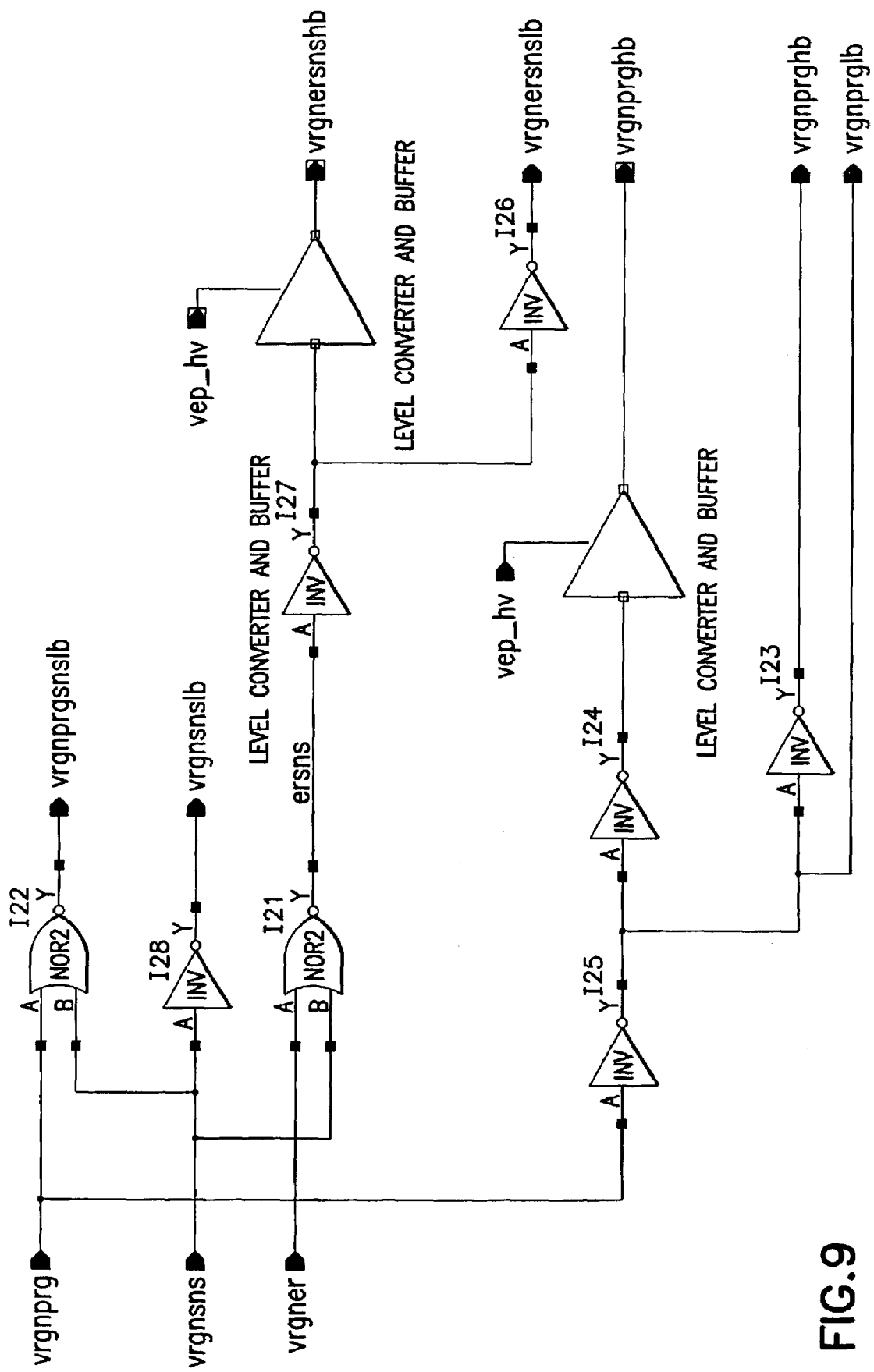
FIG. 9 is a circuit diagram of an exemplary control signal generator of FIG. 4.

FIG. 9 is a circuit diagram of an exemplary control signal generator 900 incorporating features of the present invention. As shown in FIG. 4, the control signals generated by the control signal generator 900 are supplied to the word line/source line driver 800. As shown in FIG. 9, the control signal generator 900 receives a logical value indicating whether the non-volatile memory is in a program, sense or erase mode, and generates the appropriate output signal(s) that are applied to the word line/source line driver 800. The word line/source line drivers 800 of FIG. 8 use the generated signals to provide the appropriate conditions to the transistor terminals associated with the word and source lines during the program and erase modes.

FIG. 10 is a schematic block diagram that is suitable for use by alternate embodiments of the unused state detection circuit 400 of FIG. 2. As shown in FIG. 10, an alternate unused state detection circuit 1000 includes a set of array decoders 1010, a non-volatile memory array 1020, a sense amp 1030, a pattern compare 1040, an address and control signal generator 1050 and a reference current generator 1060.

Compare Byte(s) in NVM Array to Reference Current:

In this variation, one or more dedicated bytes within the regular non-volatile memory array 240 are used. During power up, the default address and control signals coming to the non-volatile memory array 240 will be such that a read is performed on these specific byte(s). In an unused state, all bits in this byte(s) will be in a neutral state. For the exemplary technology, the neutral state is such that the cells only provide a low level of current, in the range of 1–10 μA. In contrast, a fully erased cell will provide 40 μA and a programmed cell will provide 0 μA. Therefore, when these neutral cells are sensed in comparison to a reference current (generated by block 1060) that has been set up to sense erased bits, these bits will read as all programmed. For this variation, the condition of all bits reading as programmed is deemed the unused state. Subsequently, these bytes can be erased (but cannot ever be programmed). At that point, when compared to the same reference current, these bits will read as "erased" or used.

The reference current generated by block 1060 should be set up appoximately half-way between the cell current of the neutral (unused) state and the erased state. Several methods can be used to set up this current. Two common methods are using a current source or reference array.

Compare Byte(s) in NVM Array to Preset Value:

In this variation, a byte or several bytes within the regular non-volatile memory array 240 are used. During power up, the default address and control signals coming to the non-volatile memory array 240 will be such that a read is performed on these specific byte(s). In an unused state, all bits in these byte(s) may be in a charged or uncharged state but all will be in a similar state or at least in a uniform pattern. When sensed, these byte(s) will not match the random pattern that has been selected for comparison inside the pattern compare circuit 1040. This will indicate the unused state. Subsequently, the byte(s) can be erased and programmed to the specific pattern. At that point, the comparitor 1040 will read true which will indicate the used state. The unused state is removed by simply erasing and programming a specific pattern into byte(s).

Additionally, the unused state detection circuit 400 of FIG. 2 may not solely depend on any one of these embodiments. Indeed, it should be apparent to those skilled in the art that two or more embodiments may be combined to achieve the function of the unused state detection circuit 400 of FIG. 2. This can easily be achieved by adding an OR function to the outputs of two or more embodiments such that any one or combination that detects an unused state will be enabled and the OR output will signal an unused state.

It is to be understood that the embodiments and variations shown and described herein are merely illustrative of the principles of this invention and that various modifications may be implemented by those skilled in the art without departing from the scope and spirit of the invention.

We claim:

1. A semiconductor circuit comprising:
a processor for executing one or more instructions;
a memory device; and
a circuit for detecting whether said semiconductor circuit is unused;
wherein said circuit comprises a dedicated mini-array of non-volatile memory cells for use in unused detection,
wherein said dedicated mini-array of non-volatile memory cells includes at least two active bit lines corresponding to program and erase, and wherein said first bit line is only programmable and said second bit line is only erasable.

2. The semiconductor circuit of claim 1, wherein said cells in said dedicated mini-array of non-volatile memory are initially in approximately a same state and wherein said unused state is detected by sensing said at least two active bit lines.

3. The semiconductor circuit of claim 1, wherein an offset current is added to one of said at least two active bit lines to detect when said semiconductor circuit is first used.

4. A semiconductor circuit comprising:
a processor for executing one or more instructions;
a memory device; and
a circuit for detecting whether said semiconductor circuit is unused;
wherein said memory device is a non-volatile memory array and wherein said circuit comprises a dedicated region of said non-volatile memory array,
wherein one or more dedicated bytes in said dedicated region are compared to a reference current,
wherein said one or more dedicated bytes in said dedicated region are in a neutral state when said semiconductor circuit is unused and wherein a used state of said semiconductor circuit is detected by evaluating a current generated by said one or more dedicated bytes.

5. A semiconductor circuit comprising:
a processor for executing one or more instructions;
a memory device; and
a circuit for detecting whether said semiconductor circuit is unused;
wherein said memory device is a non-volatile memory array and wherein said circuit comprises a dedicated region of said non-volatile memory array
wherein one or more dedicated bytes in said dedicated region are compared to a predefined pattern,
wherein said one or more dedicated bytes in said dedicated region have a uniform pattern that does not match a predefined pattern until said semiconductor circuit has been used.

* * * * *